(12) United States Patent
Huang et al.

(10) Patent No.: US 7,782,560 B2
(45) Date of Patent: Aug. 24, 2010

(54) LENS ACTUATOR AND CAMERA MODULE WITH SAME

(75) Inventors: Yu-Chien Huang, Taipei Hsien (TW); Hsiang-Chieh Yu, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 75 days.

(21) Appl. No.: 12/240,432

(22) Filed: Sep. 29, 2008

(65) Prior Publication Data
US 2009/0251798 A1  Oct. 8, 2009

(30) Foreign Application Priority Data
Apr. 8, 2008  (CN) .................. 2008 1 0300866

(51) Int. Cl.
*G02B 7/02*  (2006.01)
*G02B 15/14*  (2006.01)

(52) U.S. Cl. ................. 359/824; 359/694; 359/823; 359/813

(58) Field of Classification Search ......... 359/694–701, 359/811–824; 396/113; 369/44.14, 44.16
See application file for complete search history.

(56) References Cited

U.S. PATENT DOCUMENTS 7,522,351 B2 *  4/2009  Lee et al. .................... 359/694
7,643,232 B2 *  1/2010  Su et al. ..................... 359/824

* cited by examiner

*Primary Examiner*—Mohammed Hasan
(74) *Attorney, Agent, or Firm*—Andrew C. Cheng

(57) ABSTRACT

A lens actuator for driving a lens received in a lens barrel includes a plate shaped body comprising a through hole defined in the center thereof, an inner portion surrounding the through hole, an outer portion for mounting the lens barrel thereon, and a plurality of resilient portions connected between the inner portion and the outer portion. A plurality of piezoelectric structures formed on the respective resilient portions. The piezoelectric structures are configured for mounting the lens thereon and driving the lens to move relative to the lens barrel.

20 Claims, 4 Drawing Sheets

US 7,782,560 B2

LENS ACTUATOR AND CAMERA MODULE WITH SAME

CROSS REFERENCE TO RELATED APPLICATION

This application is related to commonly-assigned copending application Ser. No. 12/192,376, entitled "resilient plate and lens actuator with same". Disclosures of the above-identified application are incorporated herein by reference.

BACKGROUND

1. Technical Field

The present invention relates to a lens actuator and a camera module with the same.

2. Description of Related Art

Variable focal length lenses are widely used in optical systems. Optical systems incorporating such lenses can, for example, provide focused images of objects at varying distances without adjusting the distance between the lens and the image plane. Variable focal length lenses can also be used in optical systems that provide varying magnification without change of lenses.

Generally, the optical system usually includes an actuator, such as a step motor, to drive the lenses. However, the step motor is relatively large in volume. Use of the step motor requires a significant amount of space for movement of the lenses, which makes the optical system bulky.

Therefore, what is needed is a lens actuator adapted for driving the lenses with more compact structure and less mechanical movement.

SUMMARY

A lens actuator for driving a lens received in a lens barrel includes a plate shaped body comprising a through hole defined in the center thereof, an inner portion surrounding the through hole, an outer portion for mounting the lens barrel thereon, and a plurality of resilient portions connected between the inner portion and the outer portion. A plurality of piezoelectric structures formed on the respective resilient portions. The piezoelectric structures are configured for mounting the lens thereon and driving the lens to move relative to the lens barrel.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION OF THE EMBODIMENTS

Figure 1:
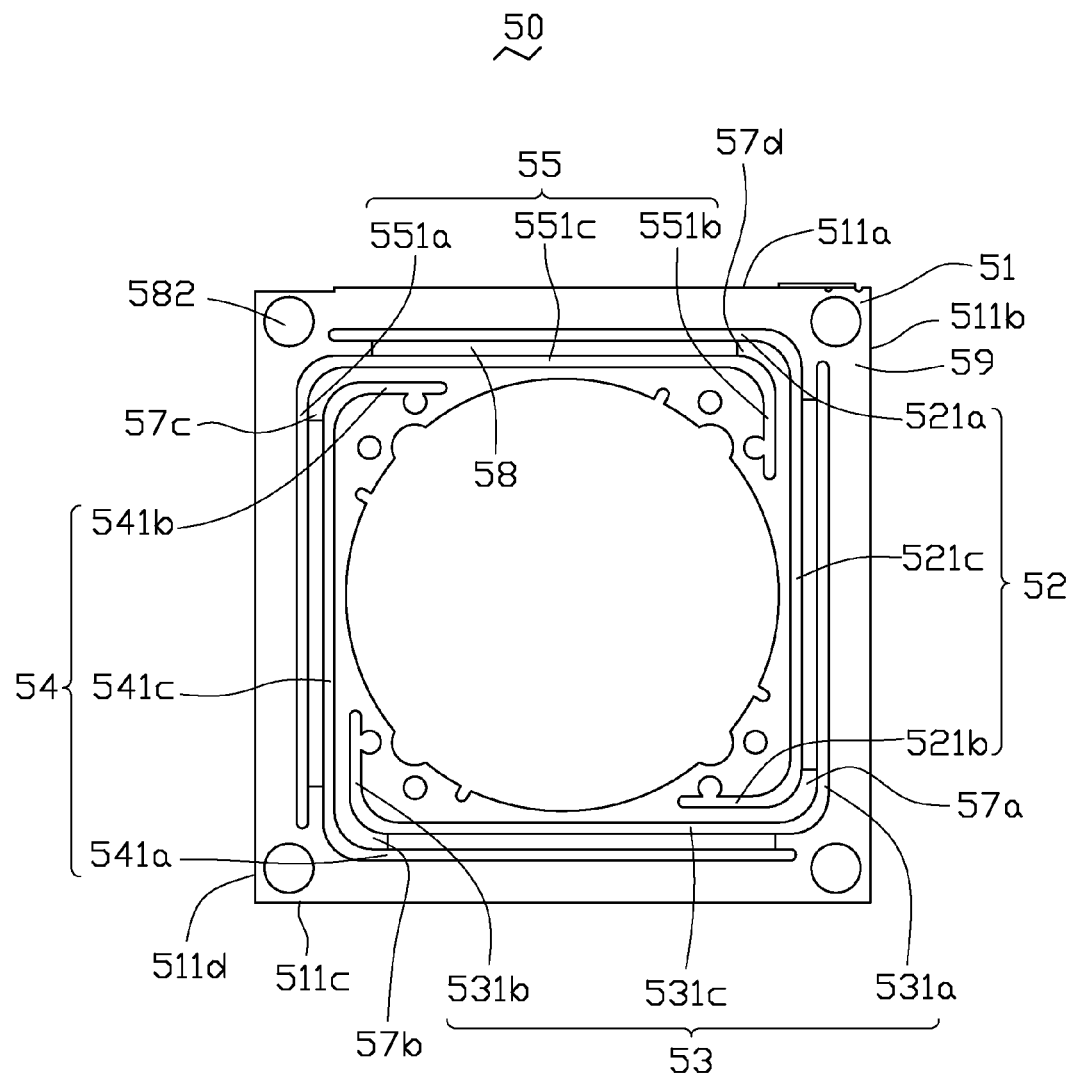
FIG. 1 is a plane view of a lens actuator according to a first embodiment of the present invention.
Figure 4:
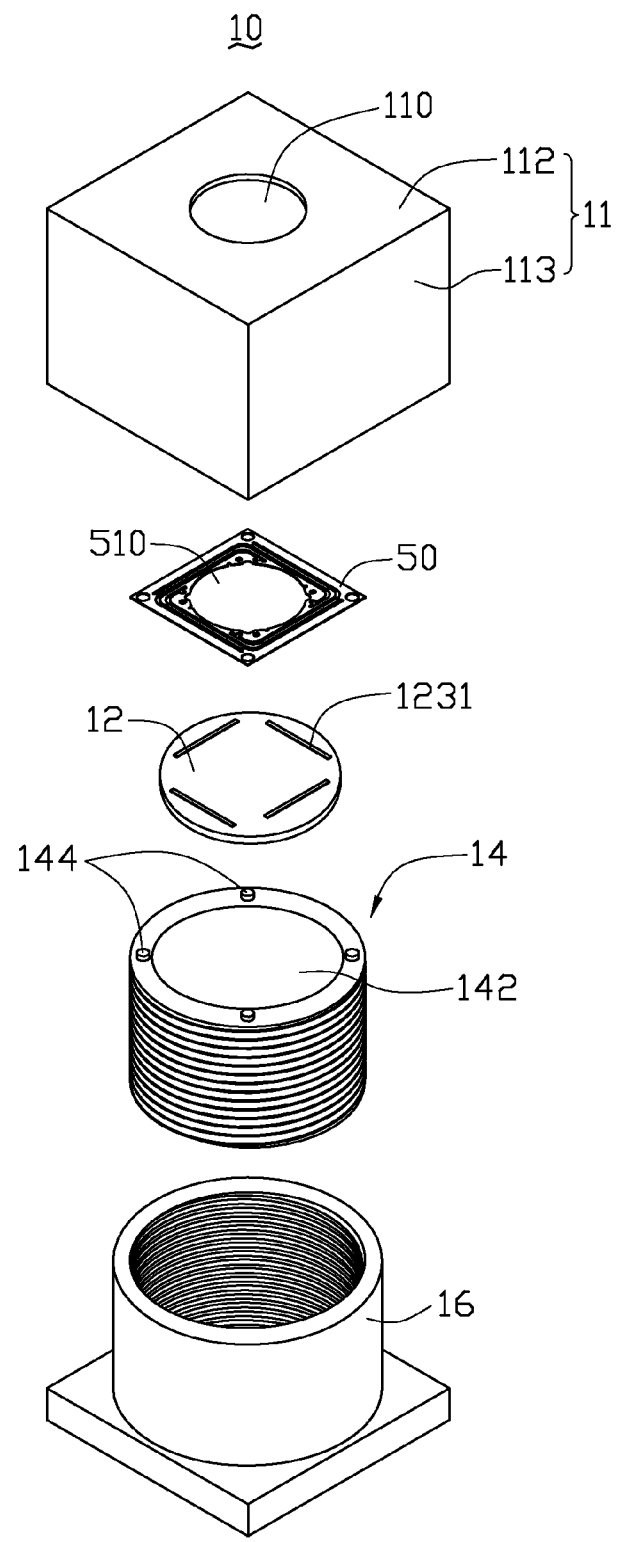
FIG. 4 is a schematic, exploded view of a camera module according to a fourth embodiment of the present invention, the camera module including a lens.

Referring to FIGS. 1 and 4, a lens actuator 50 according to the first embodiment includes a body 51. In the first embodiment, the body 51 has a square plate shape. The body 51 includes a first edge 511a, a second edge 511b, a third edge 511c, and a fourth edge 511d. The first edge 511a is parallel to the third edge 511c, and the second edge 511b is parallel to the fourth edge 511d. A through hole 510 for light passing therethrough is defined at the center of the body 51. A first slot 52, a second slot 53, a third slot 54 and a fourth slot 55 are defined in the body 51 around the through hole 510. The slots (52, 53, 54, 55) are oriented to form a square-shaped pattern symmetrically framing the central axis of the actuator 50.

The first slot 52 includes a first starting portion 521a, a first ending portion 521b, and a first connecting portion 521c. The first starting portion 521a is parallel to the first edge 511a. The first ending portion 521b is parallel to the third edge 511c. The first connecting portion 521c is parallel to the second edge 511b and connected to the first starting portion 521a and the first ending portion 521b. The length of the first ending portion 521b is less than or equal to that of the first starting portion 521a.

The second slot 53 includes a second starting portion 531a, a second ending portion 531b, and a second connecting portion 531c. The second starting portion 531a is parallel to the second edge 511b. The second ending portion 531b is parallel to the fourth edge 511d. The second connecting portion 531c is parallel to the third edge 511c and connected with the second starting portion 531a and the second ending portion 531b. The length of the second ending portion 531b is less than or equal to that of the second starting portion 531a. The second starting portion 531a and the second connecting portion 531c are on the outer side of the first slot 52, i.e., the second starting portion 531a and the second connecting portion 531c are closer to the second edge 511b and the third edge 511c than the first slot 52. A first L-shaped resilient portion 57a is arranged between the first slot 52 and the second slot 53. The resilient portion 57a has a uniform width throughout the length thereof. Since the L-shaped resilient portion 57a has an angular part or space, the durability and flexibility of the first lens actuator 50 is enhanced.

The third slot 54 includes a third starting portion 541a, a third ending portion 541b, and a third connecting portion 541c. The third starting portion 541a is parallel to the third edge 511c. The third ending portion 541b is parallel to the first edge 511a. The third connecting portion 541c is parallel to the fourth edge 511d and connected to the third starting portion 541a and the third ending portion 541b. The length of the third ending portion 541b is less than or equal to that of the third starting portion 541a. A third fixing portion 56c is formed between the through hole 510 and the angular part or space between the third ending portion 541b and the third connecting portion 541c. The third starting portion 541a and the third connecting portion 541c are on the outer side of the second slot 53, i.e., the third starting portion 541a and the third connecting portion 541c are closer to the third edge 511c and the fourth edge 511d than the second slot 53. A second L-shaped resilient portion 57b is formed between the second slot 53 and the third slot 54.

The fourth slot 55 includes a fourth starting portion 551a, a fourth ending portion 551b, and a fourth connecting portion 551c. The fourth starting portion 551a is parallel to the fourth edge 511d. The fourth ending portion 551b is parallel to the second edge 511b. The fourth connecting portion 551c is parallel to the first edge 511a and connected with the fourth starting portion 551a and the fourth ending portion 551b. The length of the fourth ending portion 551b is less than or equal to that of the fourth starting portion 551a. A fourth fixing portion 56d is formed between the through hole 510 and the angular part or space between the fourth ending portion 551b and the fourth connecting portion 551c. The fourth starting portion 551a and the fourth connecting portion 551c are on the outer side of the third slot 54, i.e., the fourth starting portion 551a and the fourth connecting portion 551c are closer to the fourth edge 511d and the first edge 511a than the third slot 54. A third L-shaped resilient portion 57c is formed between the third slot 54 and the fourth slot 55. The first starting portion 521a and the first connecting portion 521c are on the outer side of the fourth slot 55, i.e., the first starting portion 521a and the first connecting portion 521c are closer to the first edge 511d and the first edge 511a than the fourth slot 55. A fourth L-shaped resilient portion 57d is formed between the fourth slot 55 and the first slot 52.

The L-shaped resilient portions 57a, 57b, 57c and 57d can absorb energy when they are deformed elastically and then, upon unloading this energy recovered.

Four piezoelectric structures 58 are respectively formed on the L-shaped resilient portions 57a, 57b, 57c and 57d. The piezoelectric structures 58 are made of piezoelectric material, such as a piezoelectric ceramic or polyvinylidene fluoride (PVDF). The piezoelectric structures 58 are connected to an outer controlling circuit (not shown), to electrically control deformation of the piezoelectric structures 58 along a direction perpendicular to the body 51. Because the piezoelectric structures 58 is made of the piezoelectric material, which has the characteristic of electromechanical coupling, the piezoelectric structures 58 are induced to mechanically deform when an electric field is applied.

A periphery portion 59 is formed between the edges (511a, 511b, 511c and 511d) and the starting portions (521a, 531a, 541a and 551a). A hole 582 is defined in each of four corners of the periphery portion 59. The first lens actuator 50 can be fastened to a lens barrel by engagement of the holes 582 with the locating pins mounted on the lens barrel.

Figure 2:
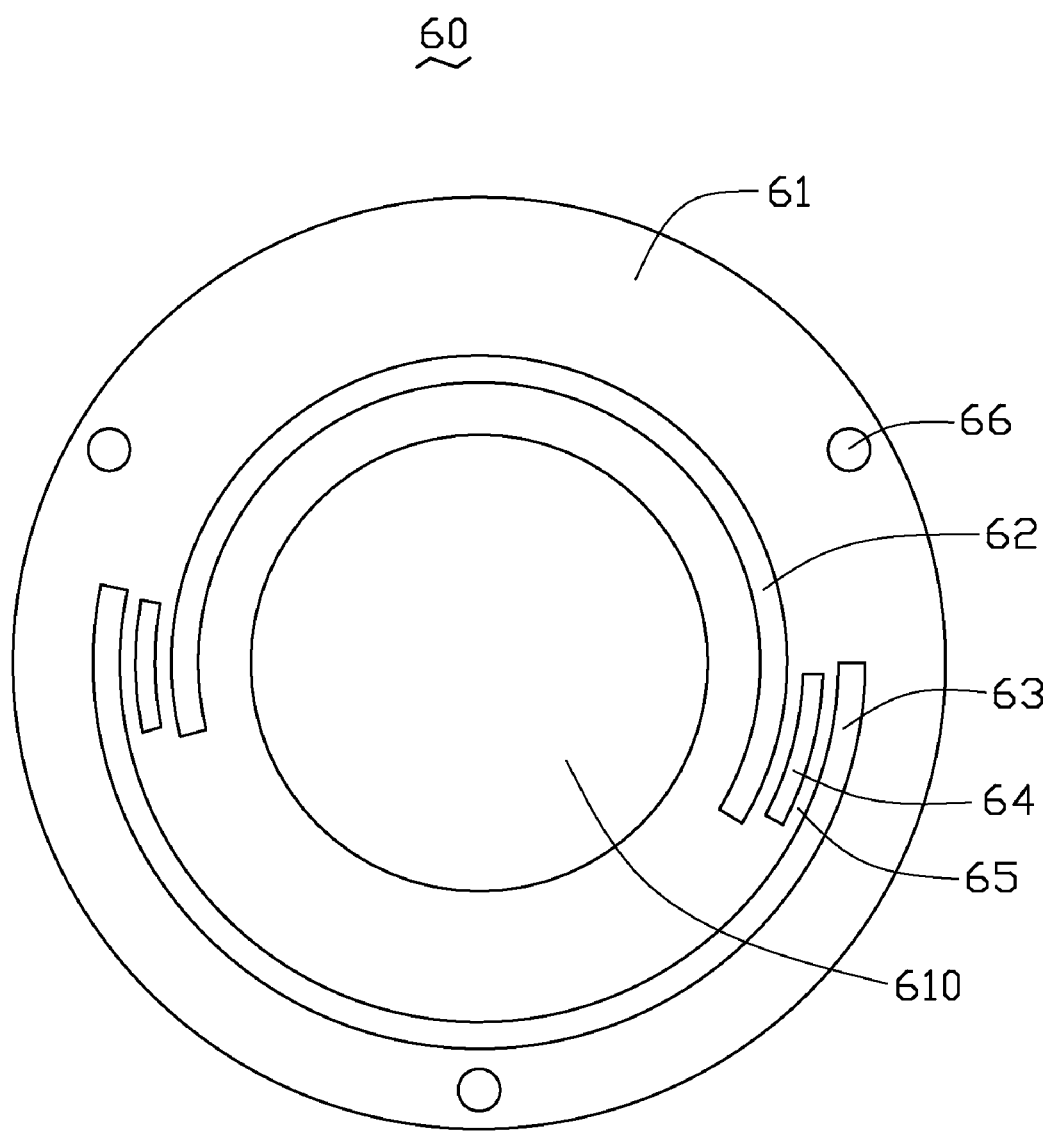
FIG. 2 is a plane view of a lens actuator according to a second embodiment of the present invention.

Referring to FIG. 2, a lens actuator 60 according to a second embodiment includes a body 61. In the present embodiment, the body 61 has a circular flat-plate shape. A through hole 610 for light passing therethrough is defined at the center of the body 61. A first arc shaped slot 62 and a second arc shaped slot 63 are defined in the body 61 around the through hole 610. The slots 62, 63 cooperatively surround the through hole 610. Resilient portions 65 are respectively arranged between two distal ends of the first slot 62 and the second slot 63. Piezoelectric structures 64 are respectively formed on the resilient portions 64. Three holes 66 are defined in the periphery portion of the body 61. The second lens actuator 60 can be fastened to a lens barrel by engagement of the holes 66 with the locating pins mounted on the lens barrel.

Figure 3:
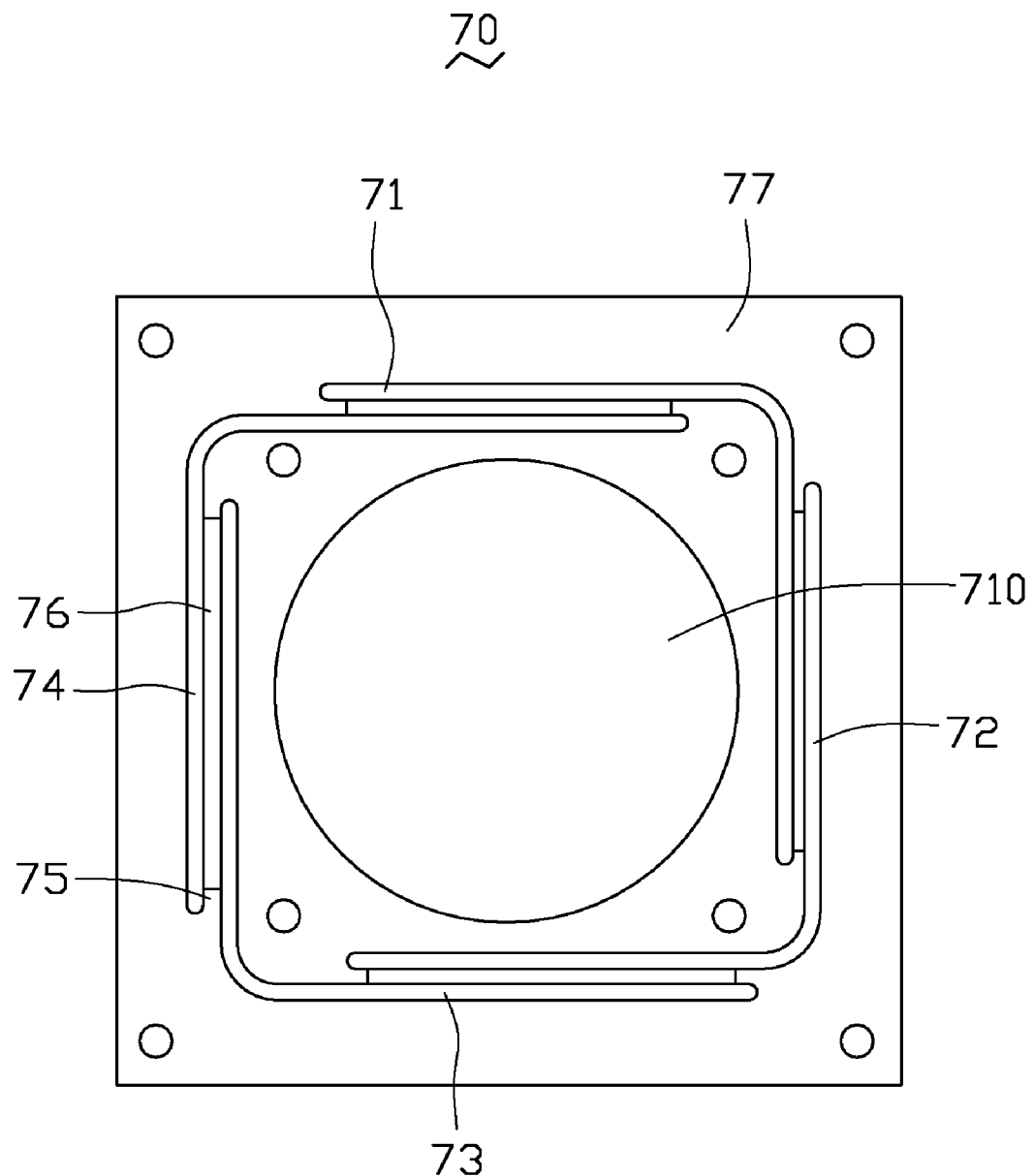
FIG. 3 is a plane view of a lens actuator according to a third embodiment of the present invention.

Referring to FIG. 3, a lens actuator 70 according to a third embodiment includes a body 77. In the present embodiment, the plate shaped body 77 has a square plate shape. A through hole 710 for light passing therethrough is defined at the center of the body 77. Four "L" shaped slots (71, 72, 73, 74) are oriented to overlap each other forming a square shaped pattern. The slots (71, 72, 73, 74) cooperatively surround the through hole 710. Resilient portions 75 are respectively arranged between two neighboring slots. Piezoelectric structures 76 are respectively formed on the resilient portions 75.

Referring to FIGS. 1, and 4, a camera module 10 according to a fourth embodiment includes a housing 11, a lens 12, a lens actuator 50, a lens barrel 14, and a lens holder 16.

The housing 11 includes a panel 112, a through hole 110 defined in the center of the panel 22. Four peripheral panels 113 respectively perpendicularly extend from the four peripheral sides of the panel 112 and fastened to one another by a dovetail panel joint (not shown). The panel 112 and the peripheral panels 113 cooperatively define a cavity for accommodating the lens holder 16. A material of the housing 11 can be an electromagnetic shield material, such as nick alloy, conductive plastic, surface conductive material, conductive glass, etc.

The lens 12 includes a central portion for light passing therethrough and a periphery portion surrounding the central portion. A plurality of protrusions 1231 corresponding to the piezoelectric structures 58 are formed on one surface of the periphery portion. The protrusions 1231 are attached to the respective piezoelectric structures 58. In the present embodiment, the protrusions 1231 are four cubic protrusions evenly disposed on the periphery portion. It is to be understood that, the protrusion 1231 can be a ring shaped protrusion surrounding the central portion. The piezoelectric structures 58 also can be directly connected to the periphery portion of the lens 12.

The lens barrel 14 can be threadedly engaged in the lens holder 16. The lens barrel 14 defines a second accommodating room 142 for accommodating the lenses and filters (not shown). The second accommodating room 412 is a through hole. Four locating pins 144 corresponding to the holes 582 protrude out from the top side of the lens barrel 14. Lens actuator 50 can be fastened to the lens barrel 14 by engagement of the holes 582 with the locating pins 144. The lens actuator 50 also can be glued (i.e., adhesively mounted) to the top side of the lens barrel 14 by adhesive.

In operation, when a change of the focal length is desired, a voltage may be applied to the lens actuator 50, such that the piezoelectric structures 58 drive the lens 12 to move relative to the lens barrel 14. Namely, deformation of the piezoelectric structures 58 results in the force along the optical axis of the lens 12, which is, in turn, applied to the lens 12. Thereby, the lens 12 is pushed or pulled by the lens actuator 50. The internal spacing between the lens 12 and other lenses is changed, and the focal length of the camera module 10 is adjusted. The adjusting range of the effective focal length of the camera module 10 may be configured to be proportional to the voltages. That is, the effective focal length of the camera module 10 can be adjusted continuously. The camera module 10 may further include a circuit including a sensor element configured for sensing the position of focal plane of the lens. The signals of the position can be used to control the electric current for the piezoelectric structures 58. Thereby, the camera module 10 can achieved auto focusing or auto zooming functions.

While certain embodiments have been described and exemplified above, various other embodiments will be apparent to those skilled in the art from the foregoing disclosure. The present invention is not limited to the particular embodiments described and exemplified but is capable of considerable variation and modification without departure from the scope of the appended claims.

What is claimed is:

1. A lens actuator for driving a lens received in a lens barrel, comprising:

a plate shaped body comprising a through hole defined therein, an inner portion surrounding the through hole, an outer portion for mounting the lens barrel thereto, and a plurality of resilient portions connected between the inner portion and the outer portion; and a plurality of piezoelectric structures formed on the respective resilient portions, the piezoelectric structure being configured for mounting the lens thereon and driving the lens to move relative to the lens barrel.

2. The lens actuator as claimed in claim 1, further comprising a plurality of slots defined in the plate shaped body and the slots cooperatively surrounding the through hole, wherein each of the resilient portions is arranged between two neighboring slots, and the slots are oriented to form a square-shaped pattern symmetrically framing the central axis of the lens actuator.

3. The lens actuator as claimed in claim 1, wherein the piezoelectric structures deform along a direction perpendicular to the plate shaped body, thereby driving the lens to move relative to the lens barrel.

4. A lens actuator for driving a lens received in a lens barrel, comprising:

a plate shaped body comprising a through hole defined therein, an inner portion surrounding the through hole, an outer portion for mounting the lens barrel thereto, and a plurality of resilient portions connected between the inner portion and the outer portion; a plurality of piezoelectric structures formed on the respective resilient portions, the piezoelectric structure being configured for mounting the lens thereon and driving the lens to move relative to the lens barrel; and a plurality of slots defined in the plate shaped body and the slots cooperatively surrounding the through hole, wherein each of the resilient portions is arranged between two neighboring slots.

5. The lens actuator as claimed in claim 4, wherein the plate shaped body is square shaped, and includes a first edge, a second edge, a third edge, and a fourth edge, the first edge is substantially parallel to the third edge, and the second edge is substantially parallel to the fourth edge.

6. The lens actuator as claimed in claim 5, wherein each of the slots includes a first substantially straight slot portion, a second substantially straight slot portion and a third substantially straight slot portion, the second substantially straight slot portion interconnected between and substantially perpendicular to the first and second substantially straight slot portions, the slots being oriented about 90 degrees with respect to each other.

7. The lens actuator as claimed in claim 6, wherein a length of the third substantially straight slot portion of each slot is less than or equal to a length of the first substantially straight slot portion.

8. The lens actuator as claimed in claim 5, wherein the resilient portions are L-shaped.

9. The lens actuator as claimed in claim 8, wherein each L-shaped resilient portion has a uniform width throughout the length thereof.

10. The lens actuator as claimed in claim 5, wherein the plurality of the slots comprises a first slot, a second slot, a third slot, and a fourth slot, the first substantially straight portion of the first slot is substantially parallel to the first edge, the second substantially straight portion of the first slot is substantially parallel to the second edge, the first substantially straight portion of the second slot is substantially parallel to the second edge, the second substantially straight portion of the second slot is substantially parallel to the third edge, the first substantially straight portion of the third slot is substantially parallel to the third edge, the second substantially straight portion of the third slot is substantially parallel to the fourth edge, and the first substantially straight portion of the fourth slot is substantially parallel to the fourth edge, the second substantially straight portion of the third slot is substantially parallel to the first edge.

11. The lens actuator as claimed in claim 5, wherein each of the slots is L-shaped, the slots being oriented about 90 degrees with respect to each other.

12. The lens actuator as claimed in claim 4, wherein the plate shaped body is ring shaped.

13. The lens actuator as claimed in claim 12, wherein each of the slots is arc shaped.

14. A camera module comprising:

a lens, a lens barrel for accommodating the lens, and a lens actuator, wherein the lens actuator comprises:

a plate shaped body comprising a through hole defined therein, an inner portion surrounding the through hole, an outer portion for mounting the lens barrel thereon, a plurality of resilient portions connected between the inner portion and the outer portion, a plurality of piezoelectric structures formed on the respective resilient portions, and a plurality of slots defined in the plate shaped body, the slots cooperatively surrounding the through hole, and each of the resilient portions being arranged between two neighboring slots, the piezoelectric structure being configured for mounting the lens thereon and driving the lens to move relative to the lens barrel.

15. The camera module as claimed in claim 14, wherein the plate shaped body is square shaped.

16. The camera module as claimed in claim 15, wherein each of the slots includes a first substantially straight slot portion, a second substantially straight slot portion and a third substantially straight slot portion, the second substantially straight slot portion interconnected between and substantially perpendicular to the first and second substantially straight slot portions, the slots being oriented about 90 degrees with respect to each other.

17. The camera module as claimed in claim 14, wherein the plate shaped body is ring shaped.

18. The camera module as claimed in claim 17, wherein each of the slots is arc shaped.

19. The camera module as claimed in claim 14, wherein each of the slots is L-shaped, the slots being oriented about 90 degrees with respect to each other.

20. The camera module as claimed in claim 14, further comprising a plurality of protrusions formed on a periphery portion of the lens, the protrusions being attached to the respective piezoelectric structures.

* * * * *